(12) United States Patent
Shinke et al.

(10) Patent No.: US 11,870,394 B2
(45) Date of Patent: Jan. 9, 2024

(54) DEMODULATOR AND WIRELESS RECEIVER INCLUDING THE SAME

(71) Applicant: SONY SEMICONDUCTOR SOLUTIONS CORPORATION, Kanagawa (JP)

(72) Inventors: Satoru Shinke, Kanagawa (JP); Tomohiro Matsumoto, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 8 days.

(21) Appl. No.: 17/597,123

(22) PCT Filed: May 25, 2020

(86) PCT No.: PCT/JP2020/020528
§ 371 (c)(1),
(2) Date: Dec. 27, 2021

(87) PCT Pub. No.: WO2021/002118
PCT Pub. Date: Jan. 7, 2021

(65) Prior Publication Data
US 2022/0247356 A1    Aug. 4, 2022

(30) Foreign Application Priority Data

Jul. 2, 2019    (JP) ................................ 2019-123318

(51) Int. Cl.
*H03D 3/00*    (2006.01)
*H04B 1/16*    (2006.01)
(Continued)

(52) U.S. Cl.
CPC .............. *H03D 3/00* (2013.01); *H03D 3/241* (2013.01); *H04B 1/16* (2013.01); *H04L 27/14* (2013.01); *H04L 27/22* (2013.01)

(58) Field of Classification Search
CPC ... H04B 1/16; H03D 3/00; H03D 3/02; H03D 3/241; H03D 3/245; H04L 27/14; H04L 27/152; H04L 27/22
See application file for complete search history.

(56) References Cited

U.S. PATENT DOCUMENTS 4,564,815 A * 1/1986 Naito ..................... H03D 3/241
                                                            455/214
9,735,790 B2 * 8/2017 Sai .......................... H03L 7/113
(Continued)

FOREIGN PATENT DOCUMENTS

JP    5-152850 A    2/2013
JP    2014-053815 A    3/2014
(Continued)

OTHER PUBLICATIONS

International Search Report and Written Opinion of PCT Application No. PCT/JP2020/020528, dated Aug. 4, 2020, 08 pages of ISRWO.

*Primary Examiner* — Ryan Johnson
(74) *Attorney, Agent, or Firm* — CHIP LAW GROUP

(57) ABSTRACT

There is provided a demodulator that makes it possible to reduce or avoid deterioration in demodulation performance due to nonlinearity of input amplitude-frequency characteristics of a variable capacitive element included in an analog control signal input section of a frequency variable oscillator, while suppressing an influence of noise. The demodulator includes: a low-resolution A/D converter that performs analog-digital conversion of a first phase difference signal to generate a second phase difference signal that is digital; a low-resolution D/A converter that performs digital-analog conversion of the second phase difference signal to generate a third phase difference signal; an analog subtractor that subtracts the third phase difference signal from the first phase difference signal to generate a first control signal; an
(Continued)

ADPLL that generates a second control signal; and an FVO that generates the oscillation signal on the basis of the first control signal and the second control signal.

12 Claims, 11 Drawing Sheets

(51) Int. Cl.
*H03D 3/24* (2006.01)
*H04L 27/14* (2006.01)
*H04L 27/22* (2006.01)

(56) References Cited

U.S. PATENT DOCUMENTS

| | | |
|---|---|---|
| 2012/0170696 A1 | 7/2012 | Taniguchi et al. |
| 2016/0173303 A1 | 6/2016 | Sai et al. |
| 2018/0062826 A1* | 3/2018 | Okuni .................. H04L 7/0331 |

FOREIGN PATENT DOCUMENTS

| | | |
|---|---|---|
| JP | 6151361 B2 | 6/2017 |
| WO | 2011/033571 A1 | 3/2011 |
| WO | 2015/025965 A1 | 2/2015 |

* cited by examiner

[FIG. 1]
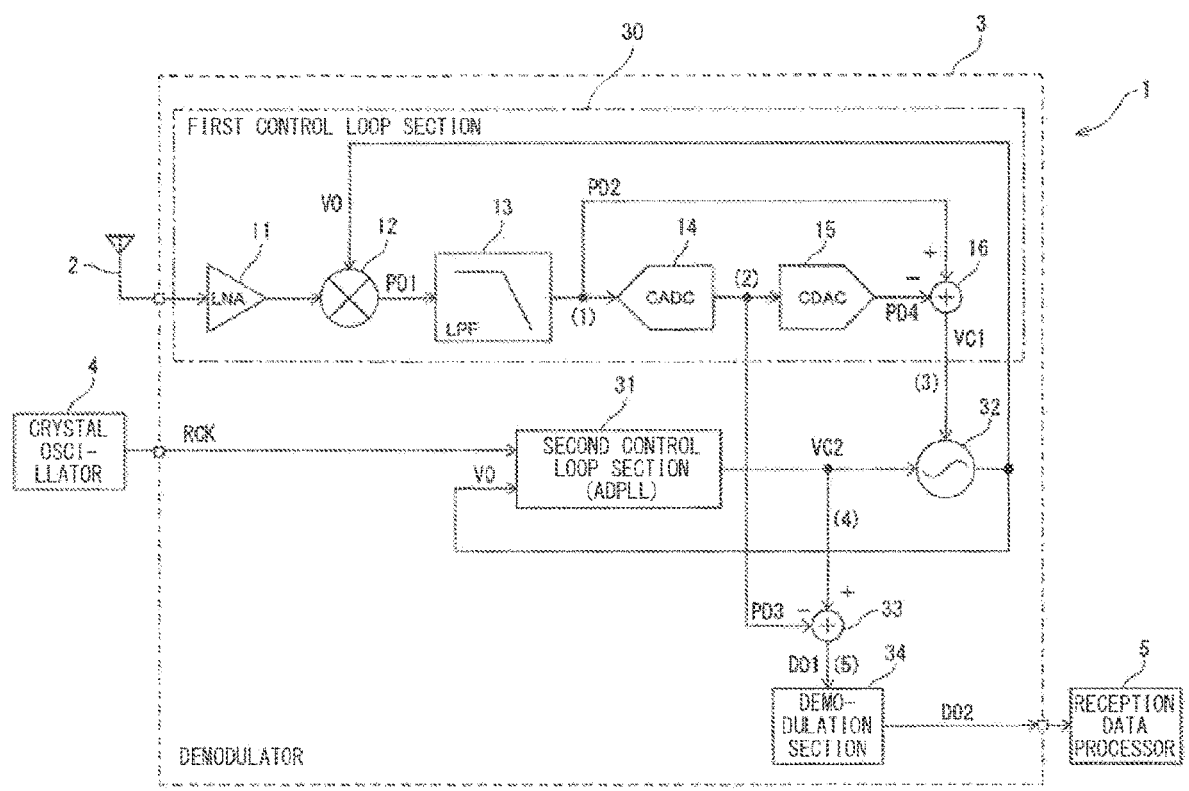

[FIG. 2]
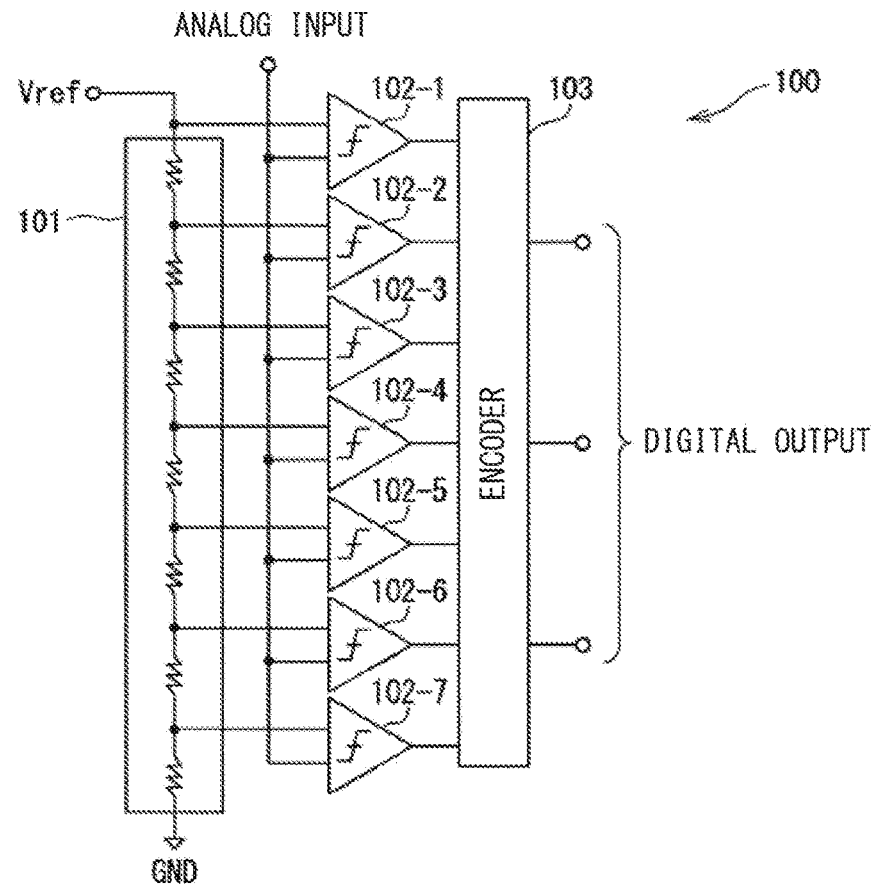
[FIG. 3]
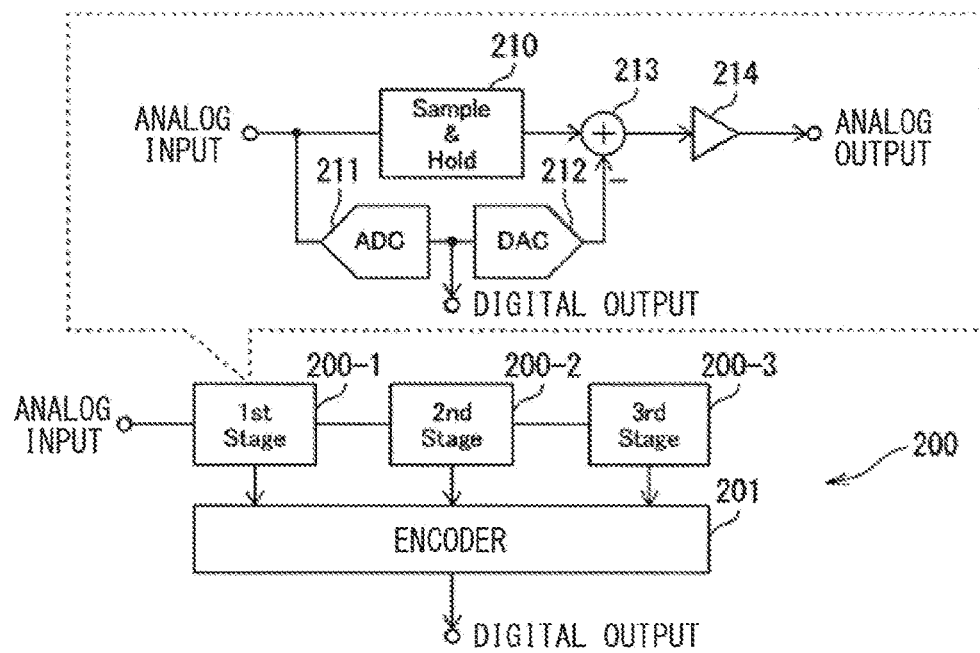

[ FIG. 4 ]
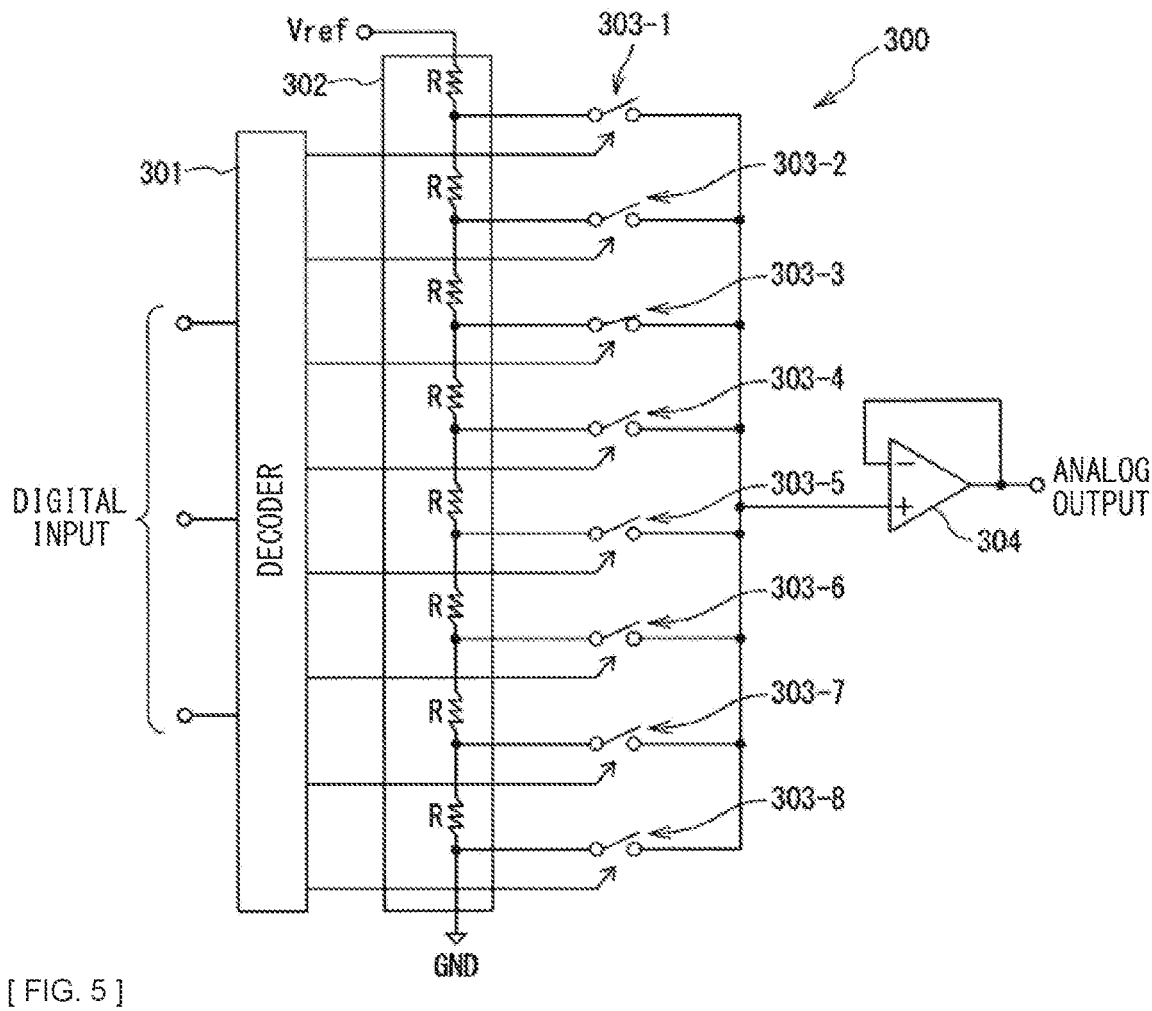
[ FIG. 5 ]
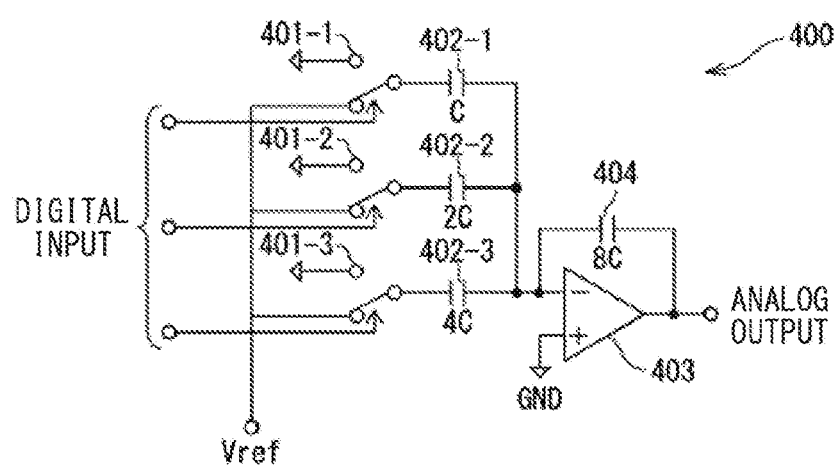

[ FIG. 6 ]
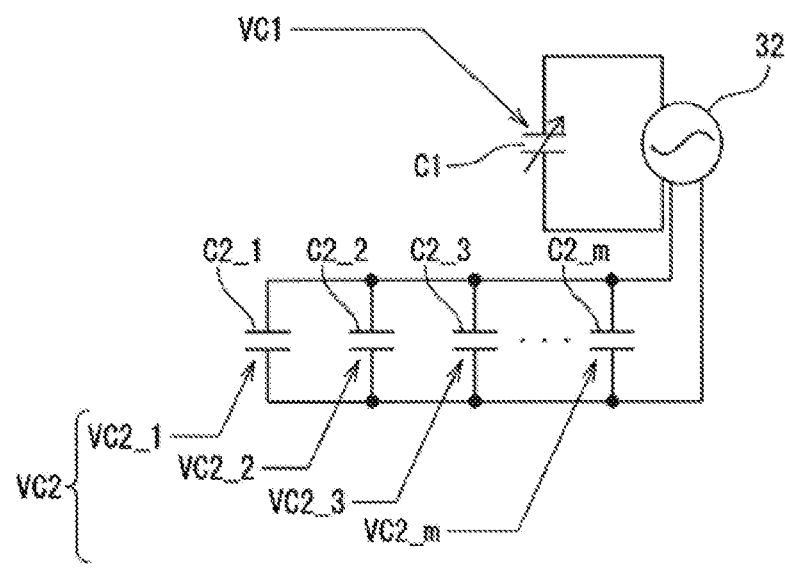

[FIG. 7]
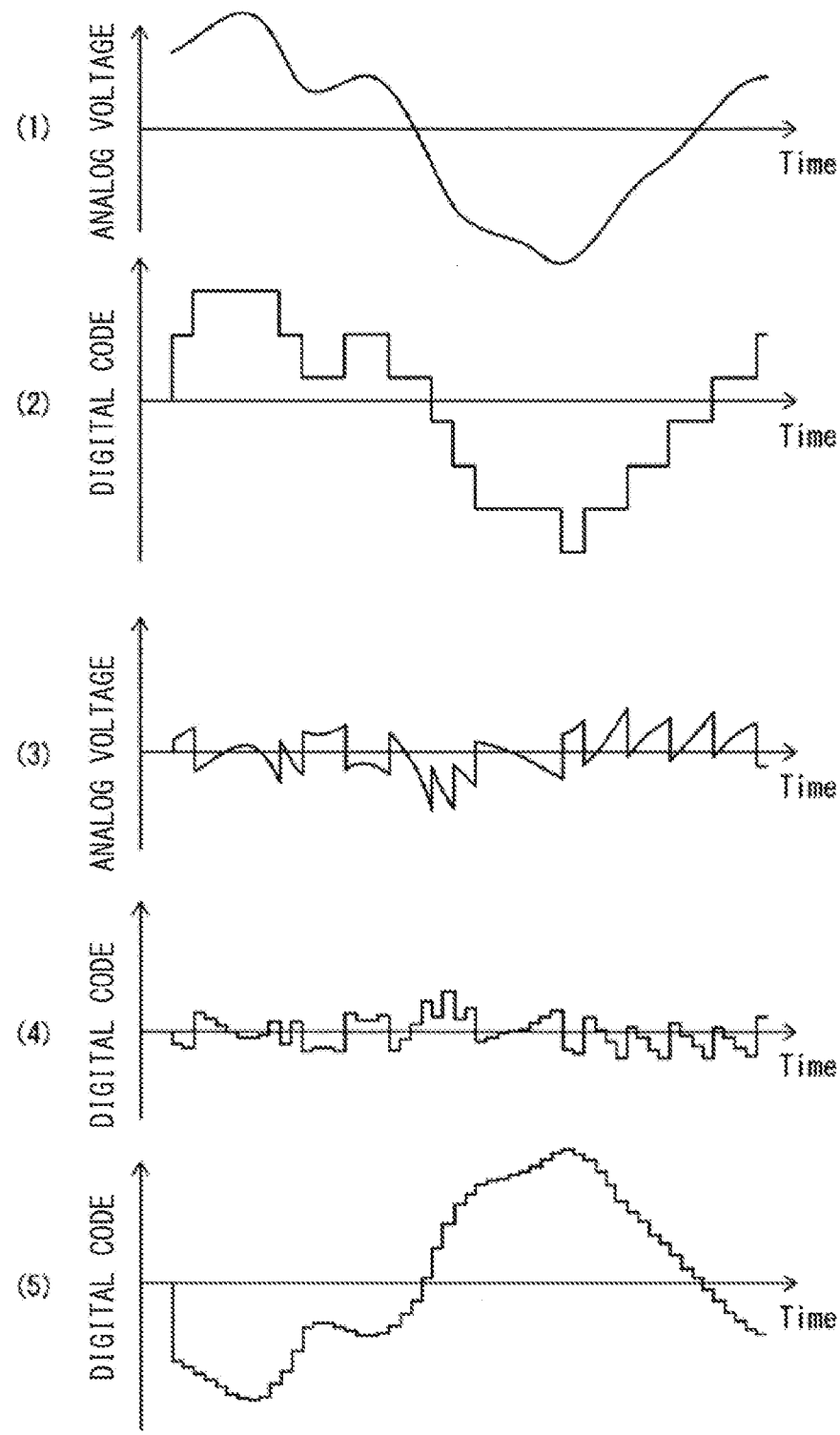

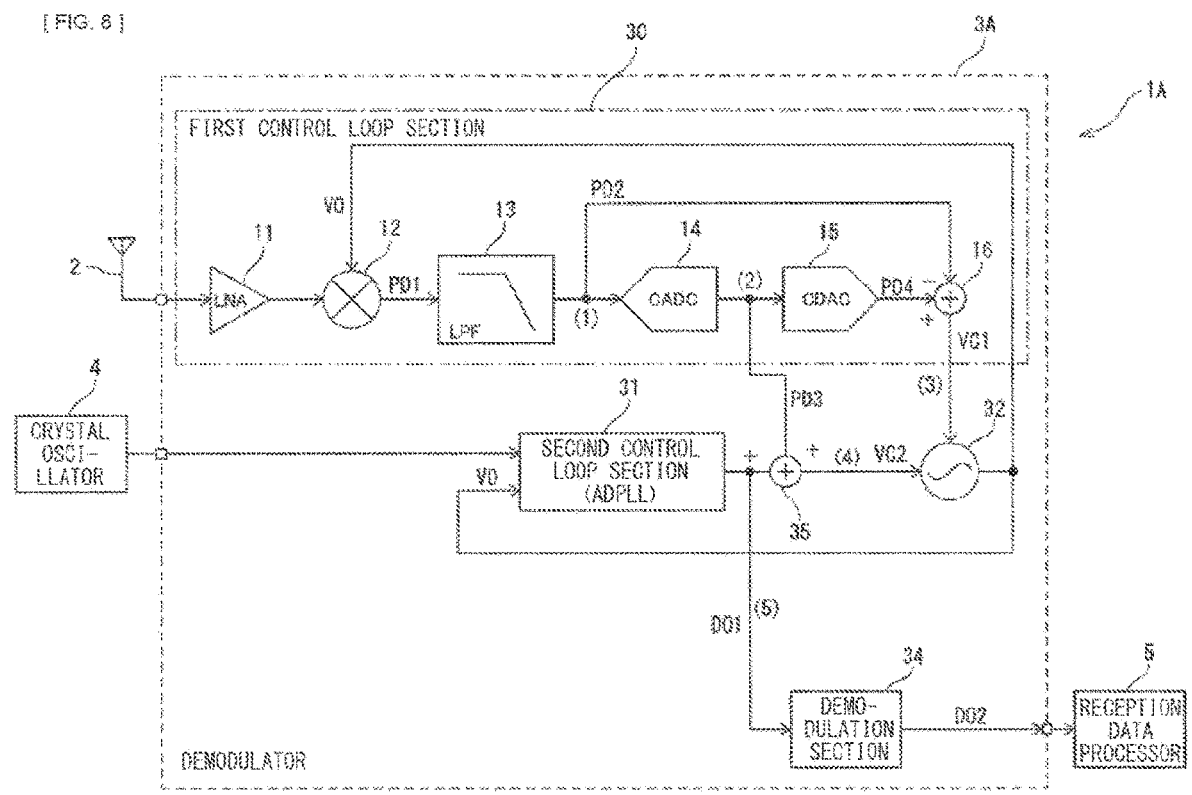

[FIG. 9]
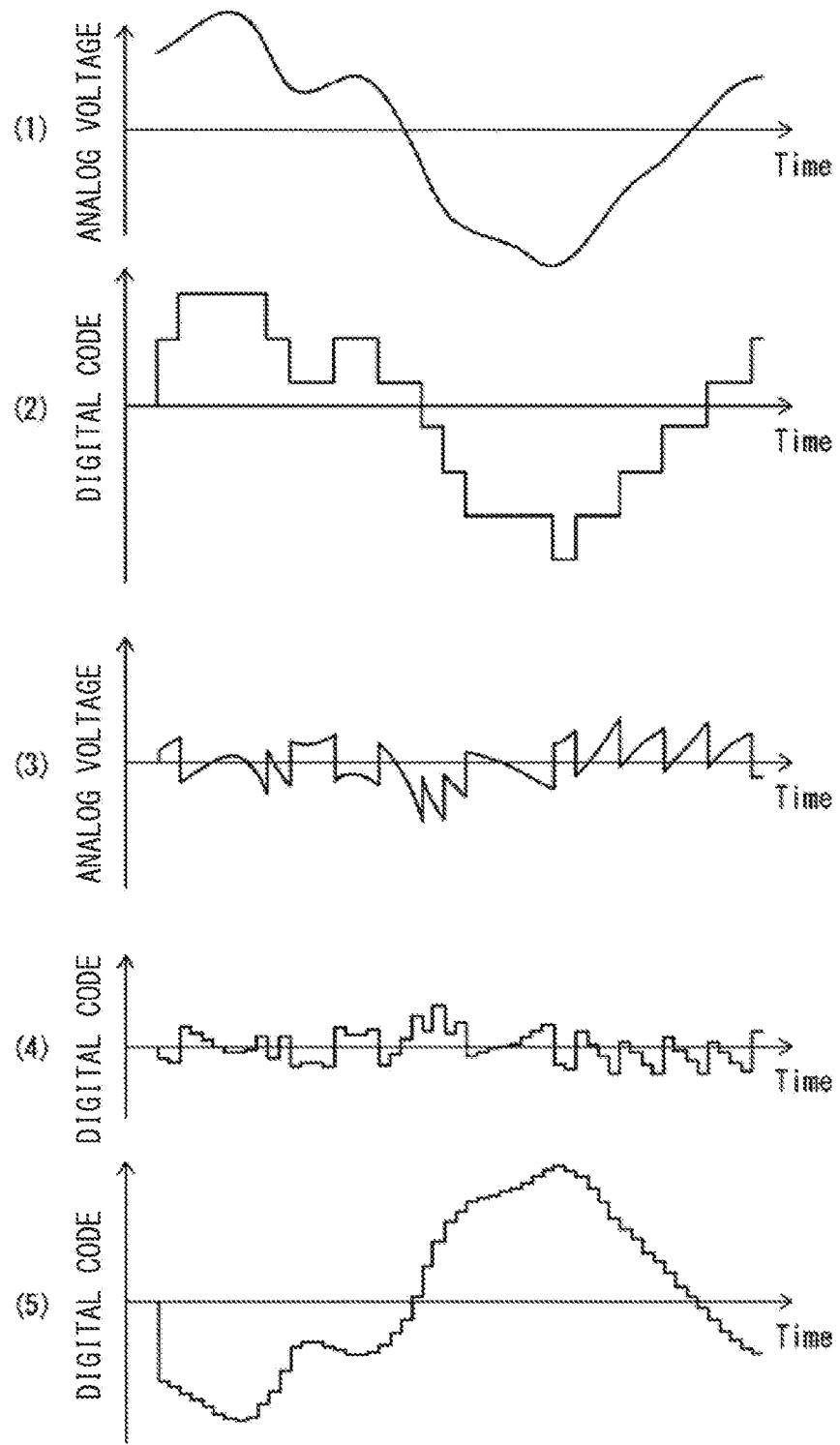

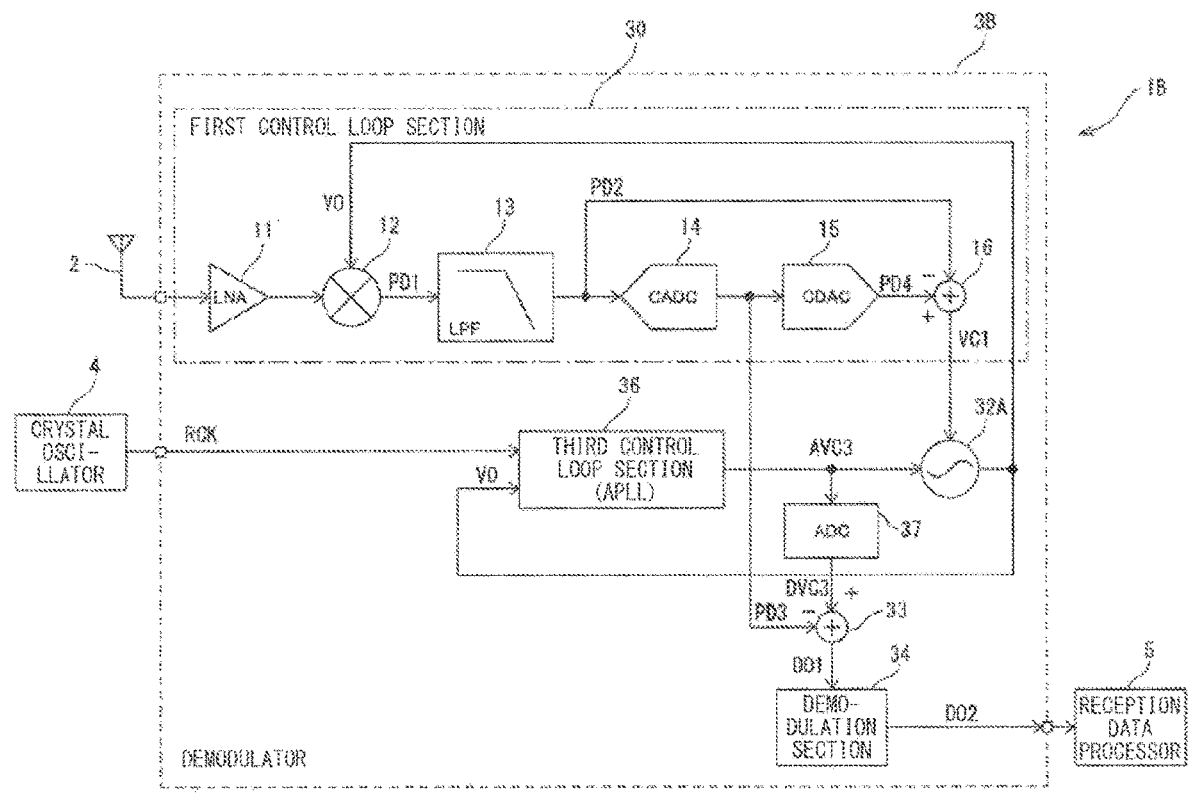
[FIG. 10]

[ FIG. 11 ]
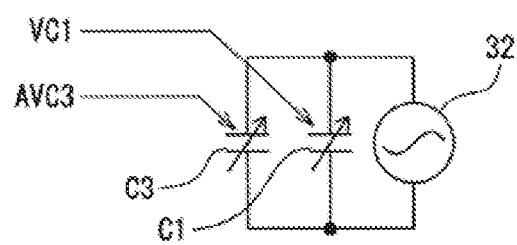

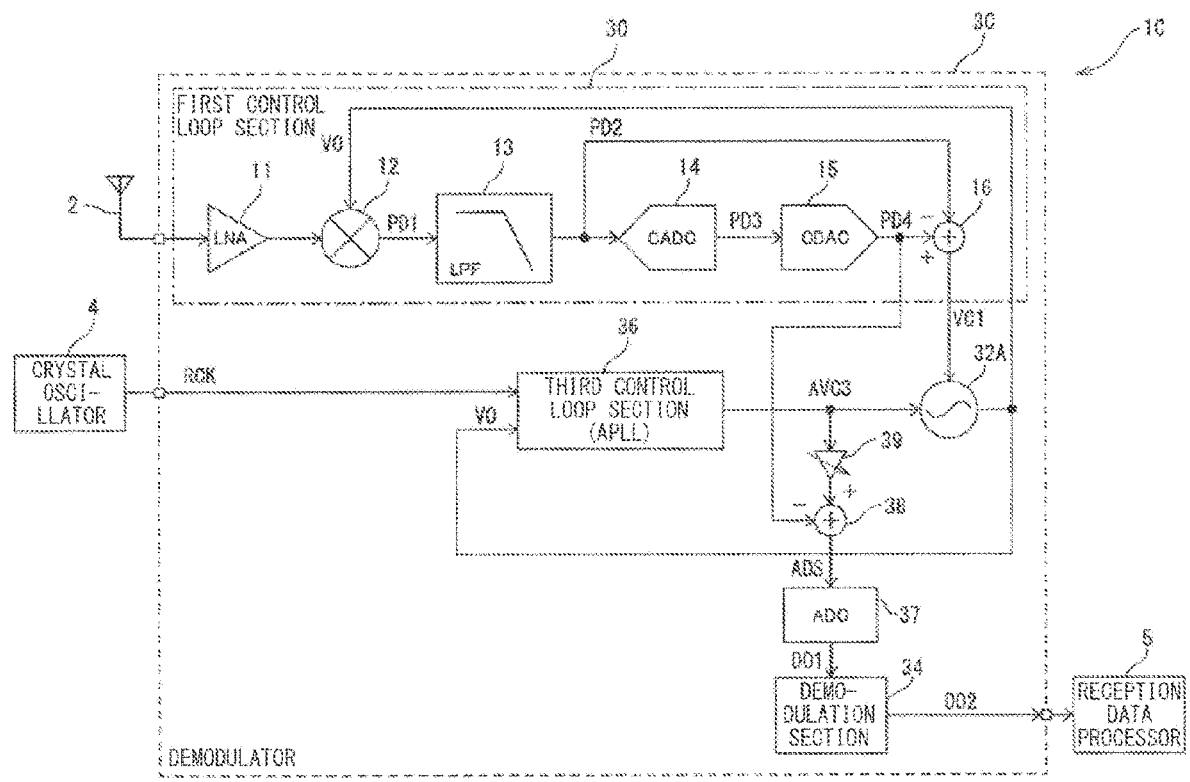
[FIG. 12]

[FIG. 13]
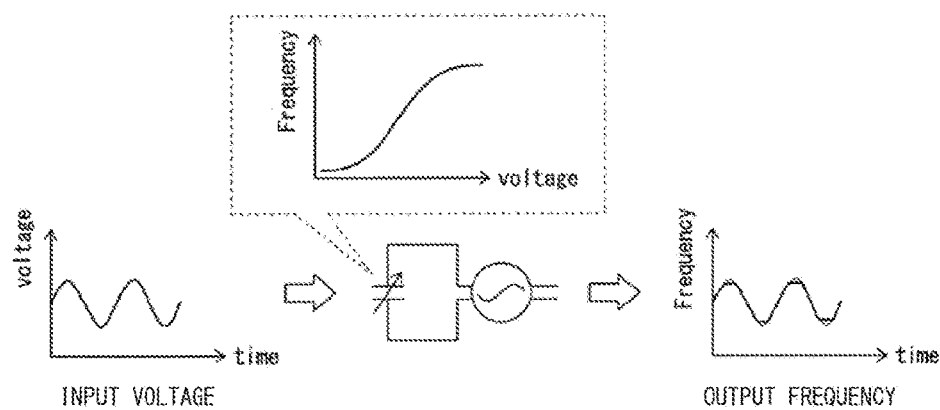

DEMODULATOR AND WIRELESS RECEIVER INCLUDING THE SAME

CROSS REFERENCE TO RELATED APPLICATIONS

This application is a U.S. National Phase of International Patent Application No. PCT/JP2020/020528 filed on May 25, 2020, which claims priority benefit of Japanese Patent Application No. JP 2019-123318 filed in the Japan Patent Office on Jul. 2, 2019. Each of the above-referenced applications is hereby incorporated herein by reference in its entirety.

TECHNICAL FIELD

The present disclosure relates to a demodulator used for wireless communication, and a wireless receiver including the same.

BACKGROUND ART

A system has been proposed that demodulates a reception signal, such as an FSK (Frequency Shift Keying) signal, received through an antenna, with use of a PLL (Phase Locked Loop) circuit.

For example, a wireless communication device described in PTL 1 includes an analog control loop section that generates an analog control signal for adjusting a phase of a voltage controlled oscillation signal (hereinafter also referred to as "VCO signal") outputted from a voltage controlled oscillator (VCO (Voltage Controlled Oscillator)), in accordance with a phase of a reception signal. In addition, the wireless communication device includes a digital control loop section. The digital control loop section includes an ADPLL (ALL-Digital Phase Locked Loop) circuit, and generates a digital control signal that is able to offset fluctuation of the phase of the VCO signal and has a phase opposite to a phase of the analog control signal. Then, the phase of the VCO signal is controlled by the generated analog control signal and the generated digital control signal to demodulate the reception signal on the basis of the digital control signal in a case where the phase of the VCO signal is locked to the phase of the reception signal (a PSK or FSK signal).

CITATION LIST

Patent Literature

PTL 1: Japanese Patent No. 6151361

SUMMARY OF THE INVENTION

Problem to be Solved by the Invention

Incidentally, it is assumed that in a frequency variable oscillator including both an analog control signal input section and a digital control signal input section in the above-described related art, for example, as illustrated in a lower middle diagram in FIG. 13, a signal having a large amplitude illustrated in a diagram on the left in FIG. 13 is inputted to the analog control signal input section. In this case, as illustrated in an upper middle diagram in FIG. 13, nonlinearity of frequency characteristics with respect to an input amplitude of a variable capacitive element included in the analog control signal input section causes distortion in a VCO signal as indicated by a solid line waveform (a portion indicated by a broken line is an ideal waveform) in a diagram on the right in FIG. 13. This consequently causes an issue of deterioration in an SNDR (Signal-to-Noise and Distortion Ratio) of the VCO signal.

To solve this issue, for example, a AGC (Auto Gain Control) function is implemented to limit an amplitude of an analog input signal (a modulation signal), which makes it possible to avoid the issue. However, a signal amplitude with respect to a noise floor is decreased; therefore, deterioration in reception performance (demodulation performance) due to noise is unavoidable.

In view of the foregoing, an object of the present disclosure is to provide a demodulator that makes it possible to reduce or avoid deterioration in demodulation performance due to nonlinearity of input amplitude-frequency characteristics of a variable capacitive element included in an analog control signal input section of a frequency variable oscillator while suppressing an influence of noise, and a wireless receiver including the same.

Means for Solving the Problem

A first aspect of the present disclosure is a modulator and a wireless receiver including the same. The modulator includes: a phase difference signal generator that generates a first phase difference signal representing a phase difference between a digitally modulated digital modulation signal and an oscillation signal; a low-resolution A/D converter that performs analog-digital conversion of the first phase difference signal with a resolution lower than at least a resolution of a digital demodulation signal, which is a final output, to generate a second phase difference signal that is digital; a D/A converter that performs digital-analog conversion of the second phase difference signal to generate a third phase difference signal that is analog; a first control signal generator that subtracts the third phase difference signal from the first phase difference signal to generate a first control signal that is analog; a second control signal generator that generates, on the basis of a reference signal and the oscillation signal, a second control signal that is analog or digital and has a phase opposite to a phase of the first control signal; a frequency variable oscillator that generates the oscillation signal on the basis of the first control signal and the second control signal; and a digital demodulation signal generator that demodulates the digital modulation signal on the basis of the second control signal.

In addition, a second aspect of the present disclosure is a modulator and a wireless receiver including the same. The modulator includes: a phase difference signal generator that generates a first phase difference signal representing a phase difference between a digitally modulated digital modulation signal and an oscillation signal; a low-resolution A/D converter that performs analog-digital conversion of the first phase difference signal with a resolution lower than at least a resolution of a digital demodulation signal, which is a final output, to generate a second phase difference signal that is digital; a D/A converter that performs digital-analog conversion of the second phase difference signal to generate a third phase difference signal that is analog; a first control signal generator that subtracts the third phase difference signal from the first phase difference signal to generate a first control signal that is analog; a second control signal generator that generates, on the basis of a reference signal and the oscillation signal, a fourth phase difference signal that is digital and has a phase opposite to a phase of the first phase difference signal, and adds the second phase difference signal to the fourth phase difference signal to generate a second control signal that is digital and has a phase opposite to a phase of the first control signal; a frequency variable oscillator that generates the oscillation signal on the basis of the first control signal and the second control signal; and a digital demodulation signal generator that demodulates the digital modulation signal on the basis of the fourth phase difference signal.

BRIEF DESCRIPTION OF THE DRAWINGS

FIG. 1 is a diagram illustrating a configuration example of a wireless receiver according to a first embodiment of the present disclosure.

FIG. 2 is a diagram illustrating a configuration example of a CADC, and illustrates an example in which the CADC includes a flash type ADC.

FIG. 3 is a diagram illustrating a configuration example of a CADC, and illustrates an example in which the CADC includes a pipeline type ADC.

FIG. 4 is a diagram illustrating a configuration example of a CDAC, and illustrates an example in which the CDAC includes a resistance ladder type DAC.

FIG. 5 is a diagram illustrating a configuration example of a CDAC, and illustrates an example in which the CDAC includes a capacitive DAC.

FIG. 6 is a diagram schematically illustrating a configuration of a signal input section of an FVO according to the first embodiment.

FIG. 7 is a waveform diagram of signals passing through wiring lines at positions indicated by (1) to (5) of FIG. 1.

FIG. 8 is a diagram illustrating a configuration example of a wireless receiver according to a modification example 1 of the first embodiment of the present disclosure.

FIG. 9 is a waveform diagram of signals passing through wiring lines at positions indicated by (1) to (5) of FIG. 8.

FIG. 10 is a diagram illustrating a configuration of a wireless receiver according to a modification example 2 of the first embodiment of the present disclosure.

FIG. 11 is a diagram schematically illustrating a configuration of a signal input section of an FVO according to the modification example 2 of the first embodiment.

FIG. 12 is a diagram illustrating a configuration of a wireless receiver according to a modification example 3 of the first embodiment of the present disclosure.

FIG. 13 is a diagram illustrating a state in which a frequency of a VCO signal in a case where a signal having a large amplitude is inputted to a VCO is distorted.

MODES FOR CARRYING OUT THE INVENTION

Hereinafter, some embodiments of the present disclosure are described in detail with reference to the drawings. In the drawings referred to in the following description, the same or similar portions are denoted by the same or similar reference signs. Besides, embodiments to be described below illustrate, by way of example, devices or methods for embodying technical ideas of the present invention, and the technical ideas of the present invention do not specifically restrict the structure, arrangement, etc. of components to those described below. Various changes can be made in the technical ideas of the present invention within the technical scope defined by claims described in the scope of claims.

First Embodiment

Configuration Example of Receiver of First Embodiment

A wireless receiver 1 according to a first embodiment of the present disclosure includes an antenna 2, a demodulator 3, a crystal oscillator 4, and a reception data processor 5, as illustrated in FIG. 1. The antenna 2 is an antenna that is able to receive electric waves in a frequency band used in a wireless communication system to which the wireless receiver 1 is applied. The demodulator 3 is a device that demodulates a digital modulation signal received through the antenna 2 to generate a digital demodulation signal. In the first embodiment, the digital modulation signal is, for example, an FSK signal or a PSK (Phase-Shift Keying) signal. The demodulator 3 includes a first control loop section 30, a second control loop section 31, a frequency variable oscillator (hereinafter referred to as "FVO") 32, a digital subtracter 33, and a demodulation section 34.

The first control loop section 30 generates a first control signal VC1, which is analog, for adjusting a phase of an oscillation signal VO outputted from the FVO 32. The first control loop section 30 includes a low-noise amplifier (hereinafter referred to as "LNA") 11, a mixer 12, a low-pass filter (hereinafter referred to as "LPF") 13, a low-resolution A/D converter 14, a low-resolution D/A converter 15, and an analog subtracter 16. Hereinafter, the low-resolution A/D converter 14 is referred to as "CADC (Coarse Analog-to-Digital-Converter) 14", and the low-resolution D/A converter 15 is referred to as "CDAC (Coarse Digital-to Analog-Converter) 15".

The LNA 11 amplifies the FSK signal or the PSK signal (hereinafter referred to as "reception signal") received though the antenna 2, and outputs the amplified reception signal to the mixer 12. The mixer 12 generates a signal representing a phase difference between the amplified reception signal from the LNA 11 and the oscillation signal VO from the FVO 32 (hereinafter referred to as "phase difference signal PD1"), and outputs the generated phase difference signal PD1 to the LPF 13.

The LPF 13 removes a unnecessary high-frequency component from the inputted phase difference signal PD1 to generate a phase difference signal, which is analog, in an intermediate frequency band (a Low IF frequency band). The LPF 13 outputs the generated phase difference signal (hereinafter referred to as "IFA phase difference signal PD2") to each of the CADC 14 and the analog subtracter 16. Here, the mixer 12 and the LPF 13 correspond to a phase difference signal generator described in the scope of claims, and the IFA phase difference signal PD2 corresponds to a first phase difference signal described in the scope of claims.

The CADC 14 is an A/D converter having a resolution of n bits (n is a natural number of n<N) that is lower than a resolution of a digital demodulation signal DO2 having a resolution of N bits (N is a natural number of 3 or more) that is a final output signal of the demodulator 3. The resolution of the CADC 14 is determined, for example, on the basis of matters such as a design rule, a layout area, power consumption, nonlinearity of a variable capacitive element of the FVO 32. That is, an optimum resolution is changed depending on conditions determined by these matters. In particular, in the present disclosure, a main object is to operate the FVO 32 in a linear region of a varactor capacitance; therefore, the resolution is set to a resolution that satisfies at least this condition. For example, in a case where the wireless receiver 1 is applied to, for example, a receiver of Bluetooth (registered trademark) and the bit number of a final output signal of this receiver is 9 to 10 bits, the resolution of the CADC 14 is set to 3 to 4 bits, for example.

The CADC 14 performs A/D conversion of the inputted IFA phase difference signal into a digital phase difference signal (hereinafter referred to as "coarse D phase difference signal PD3") having a low resolution (n bits). Then, the coarse D phase difference signal PD3 as a result of the conversion is outputted to the CDAC 15. Here, the coarse D phase difference signal PD3 corresponds to a second phase difference signal described in the scope of claims.

Here, in a case of "n=3", it is possible for the CADC 14 to include, for example, a flash type A/D converter 100 illustrated in FIG. 2. The flash type A/D converter 100 has a resolution of 3 bits, and includes a resistance ladder 101, comparators 102-1 to 102-7, and an encoder 103, as illustrated in FIG. 2.

The resistance ladder 101 includes seven resistive elements coupled in series to each other. A resistive element at one end is coupled to a power supply, and a resistive element at another end is coupled to a ground potential. The comparators 102-1 to 102-7 each have one input terminal coupled to a corresponding one of coupling sections of the resistive elements of the resistance ladder 101, and another input terminal coupled to an analog signal input terminal. These comparators 102-1 to 102-7 each compare each of divided voltages divided by the resistance ladder 101 and an analog input signal to each other, and output a result of such comparison to the encoder 103. The encoder 103 calculates a digital output on the basis of the result of the comparison inputted from each of the comparators 102-1 to 102-7.

It is to be noted that the CADC 14 is not limited to the flash type A/D converter, and may include, for example, another A/D converter such as a pipeline type A/D converter 200 illustrated in FIG. 3. The pipeline type A/D converter 200 includes three stages 200-1 to 200-3 that are cascaded, and an encoder 201, as illustrated in FIG. 3. Each stage includes a sample-hold circuit 210, an A/D converter 211 having a low resolution, a D/A converter 212 having the same resolution as that of the A/D converter 211, a subtracter 213, and an amplifier 214. An analog input signal is inputted to the sample-hold circuit 210 and the A/D converter 211. A conversion result of the A/D converter 211 is inputted to each of the D/A converter 212 and the encoder 201, and the D/A converter 212 performs D/A conversion of a coarsely A/D-converted signal that is digital, and outputs the thus-converted signal to the subtracter 213. The subtracter 213 subtracts an analog signal D/A-converted by the D/A converter 212 from the analog input signal sampled and held by the sample-hold circuit 210. A thus-obtained difference signal is amplified by the amplifier 214, and then outputted to the next stage. The next and subsequent stages each perform a similar operation on a difference signal inputted from a previous stage instead of the analog input signal. The encoder 201 calculates a digital output on the basis of each of inputted A/D conversion results.

The CDAC 15 is a D/A converter having the same resolution (n bits) as that of the CADC 14 in the first embodiment. The CDAC 15 performs D/A conversion of the inputted coarse D phase difference signal PD3 into an analog phase difference signal (hereinafter referred to as "coarse A phase difference signal PD4"). Here, the coarse A phase difference signal PD4 corresponds to a third phase difference signal described in the scope of claims. Then, the coarse A phase difference signal PD4 that is a result of the conversion is outputted to the analog subtracter 16. It is to be noted that the resolution of the CDAC 15 is not limited to the same resolution, and may be another resolution as long as the resolution of the CDAC 15 is higher than the resolution of the CADC 14.

Here, in a case of "n=3", it is possible for the CDAC 15 to include, for example, a resistance ladder type D/A converter 300 illustrated in FIG. 4. The resistance ladder type D/A converter 300 is a decoder system D/A converter, and includes a decoder 301 to which a 3-bit digital signal is inputted, and a resistance ladder 302 including eight resistive elements having a resistance value R that are coupled in series to each other. A resistive element at one end of the resistance ladder 302 is coupled to a reference potential Vref, and a resistive element at another end is coupled to a ground potential GND.

The resistance ladder type D/A converter 300 further includes eight switches 303-1 to 303-8 each having a terminal on the left coupled to a corresponding one of coupling sections of the resistive elements of the resistance ladder 302. The resistance ladder type D/A converter 300 further includes an amplifier 304. The amplifier 304 has a non-inversion input terminal coupled to all terminals on the right of the switches 303-1 to 303-8, and has an inversion input terminal coupled to an output terminal. A decoded signal from the decoder 301 is inputted to control terminals (not illustrated) of the switches 303-1 to 303-8, and one of the switches 303-1 to 303-8 is turned on (the switch 303-3 is turned on in an example illustrated in FIG. 4). As a result, a voltage of an integral multiple of $Vref/2^3$ is inputted to the non-inversion input terminal of the amplifier 304 through the switch that is turned on. The amplifier 304 operates as a unity gain buffer having a gain of 1, and outputs a voltage inputted to the non-inversion input terminal as an analog output of an A/D conversion result from the output terminal.

It is to be noted that the D/A converter is not limited to the resistance ladder type, and may include, for example, any other D/A converter such as a capacitive D/A converter 400 illustrated in FIG. 5. The capacitive D/A converter 400 includes three switches 401-1 to 401-3, three capacitive elements 402-1 to 402-3, an amplifier 403, and a feedback capacitive element 404, as illustrated in FIG. 5. The switches 401-1 to 401-3 each have total three terminals including two terminals on the upper left and lower left and one terminal on the right. Each of the terminals on the upper left is coupled to a ground potential, and each of the terminals on the lower left is coupled to the reference potential Vref. Each of the terminals on the right is coupled to a left end of a corresponding one of the capacitive elements 402-1 to 402-3. The capacitive element 402-1 has an electrostatic capacitance of a reference capacitance C, and the capacitive elements 402-2 and 402-3, and the feedback capacitive element 404 have electrostatic capacitances (2 C, 4 C, and 8 C) equal to the reference capacitance weighted by a power of 2. Right ends of the capacitive elements 402-1 to 402-3 are coupled to an inversion input terminal of the amplifier 403. A non-inversion input terminal of the amplifier 403 is coupled to the ground potential GND. In addition, the feedback capacitive element 404 is coupled between the inversion input terminal and an output terminal of the amplifier 403.

A digital input signal is inputted to control terminals (not illustrated) of the switches 401-1 to 401-3, and the switches are changed in accordance with a signal level (High or Low) of the digital input signal to cause the terminal on the right and the terminal on the upper left or the terminal on the lower left to be short-circuited. Accordingly, when the terminal on the right and the terminal on the lower left are short-circuited, a voltage corresponding to a weighted capacitance of a capacitive element, corresponding to a short-circuited switch, of the capacitive elements 402-1 to 402-3 is inputted to the non-inversion input terminal of the amplifier 403. Then, in the amplifier 403, the inputted voltage is added to obtain an analog output.

The analog subtracter 16 subtracts the inputted coarse A phase difference signal PD4, which is analog, from the inputted IFA phase difference signal PD2, which is analog, and outputs, as a first control signal VC1, a difference signal that is a result of such subtraction to the FVO 32. Here, the analog subtracter 16 corresponds to a first control signal generator described in the scope of claims.

Here, in an existing configuration described in PTL 1, as described above, a phase difference signal (an IFA phase difference signal) outputted from an LPF is directly inputted to a VCO; therefore, in a case where the IFA phase difference signal is, for example, a signal having a large amplitude to such an extent as to cover a nonlinear region of a varactor capacitance of a variable capacitive element such as a variable capacitance diode, distortion occurs in an oscillation signal. In contrast, in the first embodiment, a difference signal (a signal having an amplitude equal to or lower than the resolution of the CADC 14) obtained by subtracting the coarse A phase difference signal PD4 from the IFA phase difference signal PD2 is outputted as the first control signal VC1 to the FVO 32. This makes it possible to input a signal having a smaller amplitude than that of the IFA phase difference signal PD2 to the FVO 32. That is, the resolution of the CADC 14 is set to a resolution causing the first control signal VC1 to have a small amplitude to such an extent as to fall within a linear region of the varactor capacitance, which makes it possible to operate the FVO 32 within the linear region of the varactor capacitance.

The second control loop section 31 generates a second control signal VC2 on the basis of the reference signal RCK supplied from the crystal oscillator 4 and the oscillation signal VO inputted from the FVO 32. The second control signal VC2 is a digital control signal that is able to offset fluctuation of a phase of the oscillation signal VO and has a phase opposite to the phase of the first control signal VC1. Here, the second control loop section 31 includes an ADPLL circuit in the first embodiment. Hereinafter, the second control loop section 31 is referred to as "ADPLL 31". Here, the second control loop section (ADPLL) 31 corresponds to a second control signal generator described in the scope of claims.

The ADPLL 31 has negative feedback characteristics in which a frequency of the oscillation signal VO of the FVO 32 tend to be kept constant, and in a case where disturbance that forces the frequency of the first control signal VC1 to change occurs, the ADPLL 31 operates to cancel out the disturbance. In the first embodiment, a set frequency of the ADPLL 31 is adjusted to a carrier frequency of a reception signal. In addition, a loop gain of the ADPLL 31 is set to be higher than a loop gain of the first control loop section 30.

The FVO 32 generates the oscillation signal VO on the basis of the inputted first control signal VC1, which is analog, and the second control signal VC2, which is digital. Then, the generated oscillation signal VO is outputted to each of the mixer 12 and the ADPLL 31.

Here, although not illustrated, the FVO 32 includes a first input section and a second input section. The first input section is an input section for the first control signal VC1, which is analog, and includes a variable capacitive element.

The second input section is an input section for the second control signal VC2, which is digital, and includes a plurality of capacitive elements having a fixed capacitance (hereinafter referred to as "fixed capacitive elements"). In the first embodiment, the variable capacitive element is, for example, a variable capacitance diode. The second control signal VC2, which is digital, is inputted to the second input section; therefore, the second input section has a configuration in which at least the same number of signal input sections as the bit number m (m is a natural number of 2 or more) of the second control signal are coupled in parallel to each other. The signal input sections each include the fixed capacitive element. In the first embodiment, the fixed capacitive element is, for example, a capacitor having a fixed electrostatic capacitance.

That is, the FVO 32 has a configuration including both the first input section constituting a signal input section of a voltage control oscillator (VCO) and the second input section constituting a signal input section of a digital control oscillator (DCO). It is to be noted that the first input section and the second input section are coupled in parallel to each other, and are coupled to a common oscillation circuit (not illustrated) capable of varying an oscillation frequency on the basis of a combined capacitance of them.

That is, for example, as illustrated in FIG. 6, in the FVO 32, the first input section has a variable capacitance C1, and the second input section is equivalent to, for example, having m fixed capacitances C2_1 to C2_m coupled in parallel to each other. In FIG. 6, VC2_1 to VC2_m each indicate a signal corresponding to each bit of the second control signal VC2 having m bits. The fixed capacitive elements C2_1 to C2_m are respectively turned to selection (ON) or non-selection (OFF) in accordance with signal levels (High or Low) of the signals VC2_1 to VC2_m corresponding to respective bits to change a combined electrostatic capacitance (hereinafter referred to as "combined capacitance C2"). Accordingly, the variable capacitance C1 becomes a variable electrostatic capacitance corresponding to the first control signal VC1, and the combined capacitance C2 becomes a variable electrostatic capacitance corresponding to the second control signal VC2. The second control signal VC2 is a signal having a phase opposite to the phase of the first control signal VC1, which causes the variable capacitance C1 and the combined capacitance C2 to cancel out each other. That is, regarding fluctuation of the frequency of the first control signal VC1 (the reception signal), the second control signal VC2 acts to prevent the fluctuation.

The digital subtracter 33 subtracts the inputted coarse D phase difference signal PD3, which is digital, from the inputted second control signal VC2, which is digital, and outputs a digital signal DO1 that is a result of such subtraction to the demodulation section 34. Actually, a sign of the coarse D phase difference signal PD3 is inverted; therefore, this subtraction is addition of negative values.

The demodulation section 34 executes publicly known demodulation processing on the inputted digital signal DO1 to generate the digital demodulation signal DO2. Then, the generated digital demodulation signal DO2 is outputted to the reception data processor 5. Here, the demodulation section 34 corresponds to a digital demodulation signal generator described in the scope of claims.

The crystal oscillator 4 outputs the reference signal RCK used in the ADPLL 31 to the ADPLL 31. The reception data processor 5 performs, on the digital demodulation signal DO2, processing corresponding to a system to which the wireless receiver 1 is applied. Here, as an application target system, for example, the wireless receiver 1 is applicable to any system that receives an FSK signal and a PSK signal such as a wireless LAN and Bluetooth, for example.

[Operation of Wireless Receiver 1]

Next, description is given of a specific operation of the wireless receiver 1 according to the first embodiment with reference to FIG. 7. Here, FIG. 7 is a waveform diagram of signals passing through wiring lines at positions indicated by (1) to (5) of FIG. 1. In addition, regarding signal waveforms in (1) and (3) of FIG. 7, a vertical axis indicates an analog voltage value, and a horizontal axis indicates time. Regarding signal waveforms in (2), (4), and (5) of FIG. 7, a vertical axis indicates a digital code value, and a horizontal axis indicates time.

In a case where the wireless receiver 1 according to the first embodiment receives, for example, an FSK signal through the antenna 2, the mixer 12 generates a phase difference signal PD1 that is a difference signal between the FSK signal and an oscillation signal VO from the FVO 32. Then, the generated phase difference signal PD1 is outputted to the LPF 13. The LPF 13 removes an unnecessary high-frequency component from the phase difference signal PD1 to generate, for example, the IFA phase difference signal PD2 in an intermediate frequency band as illustrated in (1) of FIG. 7. Then, the generated IFA phase difference signal PD2 is outputted to each of the CADC 14 and the analog subtracter 16.

The CADC 14 here includes an A/D converter having a resolution of 3 bits. The CADC 14 performs coarse A/D conversion of the inputted IFA phase difference signal PD2 with a resolution of 3 bits to generate, for example, the coarse D phase difference signal PD3 as illustrated in (2) of FIG. 7. Then, the generated coarse D phase difference signal PD3 is outputted to each of the CDAC 15 and the digital subtracter 33.

The CDAC 15 includes a D/A converter having a resolution of 3 bit that is the same as the resolution of the CADC 14. The CDAC 15 performs coarse D/A conversion of the inputted coarse D phase difference signal PD3 with a resolution of 3 bits to generate the coarse A phase difference signal PD4 (not illustrated). Then, the generated coarse A phase difference signal PD4 is outputted to the analog subtracter 16.

The analog subtracter 16 subtracts the inputted coarse A phase difference signal PD4 from the inputted IFA phase difference signal PD2 to generate, for example, the first control signal VC1, which is analog, as illustrated in (3) of FIG. 7. Then, the generated first control signal VC1 is outputted to the FVO 32.

Meanwhile, the ADPLL 31 generates, for example, the second control signal VC2 as illustrated in (4) of FIG. 7, which is digital and has a phase opposite to the phase of the first control signal VC1 illustrated in (3) of the same diagram, on the basis of the inputted reference signal RCK and the inputted oscillation signal VO. Then, the generated second control signal VC2 is outputted to each of the FVO 32 and the digital subtracter 33.

In addition, the FVO 32 generates the oscillation signal VO on the basis of the inputted first control signal VC1 and the inputted second control signal VC2. Then, the generated oscillation signal VO is outputted to each of the mixer 12 and the ADPLL 31.

In addition, the digital subtracter 33 subtracts the inputted coarse D phase difference signal PD3 from the inputted second control signal VC2 to generate, for example, the digital signal DO1 as illustrated in (5) of FIG. 7. Then, the generated digital signal DO1 is outputted to the demodulation section 34. Here, the digital signal DO1 has an inverted and A/D-converted waveform of the IFA phase difference signal PD2 illustrated in (1) of FIG. 7.

The demodulation section 34 performs publicly known demodulation processing on the inputted digital signal DO1 to generate the digital demodulation signal DO2 obtained by performing digital demodulation of the received FSK signal. Then, the generated digital demodulation signal DO2 is outputted to the reception data processor 5.

The reception data processor 5 performs predetermined processing, corresponding to a system to which the wireless receiver 1 is applied, on the inputted digital demodulation signal DO2. For example, in a case where the wireless receiver 1 is applied to a system that performs transmission and reception of photograph data between a digital camera and a smartphonet by Bluetooth, processing of displaying a photograph image on a display section is performed as the predetermined processing on the basis of demodulated photograph data.

[Workings and Effects of First Embodiment]

In the wireless receiver 1 according to the first embodiment, the mixer 12 and the LPF 13 generates the IFA phase difference signal PD2 that represents a phase difference between the FSK signal or the PSK signal received through the antenna 2 and the oscillation signal VO. The low-resolution A/D converter 14 performs analog-digital conversion of the IFA phase difference signal PD2 with a resolution (n bits) lower than at least the resolution (N bits) of the digital demodulation signal DO2 that is a final output to generate the coarse D phase difference signal PD3, which is digital. The low-resolution D/A converter 15 performs digital-analog conversion of the coarse D phase difference signal PD3 to generate the coarse A phase difference signal PD4, which is analog. The analog subtracter 16 subtracts the coarse A phase difference signal PD4 from the IFA phase difference signal PD2 to generate the first control signal VC1, which is analog. The second control loop section (ADPLL) 31 generates the second control signal VC2 that is digital and has a phase opposite to the phase of the first control signal VC1, on the basis of the reference signal RCK and the oscillation signal VO. The FVO 32 generates the oscillation signal VO on the basis of the first control signal VC1 and the second control signal VC2.

Specifically, the FVO 32 includes the first input section and the second input section. The first input section is an input section for the first control signal VC1, which is analog, and includes a variable capacitive element (e.g., a variable capacitance diode). The second input section is an input section for the second control signal VC2, which is digital, and includes a plurality of fixed capacitive elements. Here, the first input section and the second input section are coupled in parallel to each other. In addition, the second input section has a configuration in which at least the same number of signal input sections each including a fixed capacitive element as the bit number m of the second control signal are coupled in parallel to each other. That is, the FVO 32 according to the first embodiment is configured to generate the oscillation signal VO on the basis of the first control signal VC1, which is analog and is inputted to the first input section, and the second control signal VC2, which is digital and is inputted to the second input section.

Further, in the wireless receiver 1, the digital subtracter 33 subtracts the coarse A phase difference signal PD4 from the second control signal VC2 to generate the digital signal DO1. The demodulation section 34 generates the digital demodulation signal DO2 obtained by performing digital demodulation of the received FSK signal or PSK signal on the basis of the digital signal DO1.

This configuration makes it possible to input the first control signal VC1 obtained by subtracting the coarse A phase difference signal PD4 from the IFA phase difference signal PD2 without directly inputting the IFA phase difference signal PD2 to the FVO 32. This makes it possible to convert the IFA phase difference signal PD2 having a large amplitude into a signal having a smaller amplitude than the large amplitude and input the thus-converted signal as the first control signal VC1 to the FVO 32. As a result, it is possible to reduce deterioration in reception performance due to distortion of the oscillation signal VO caused by nonlinearity of the varactor capacitance of the first input section, as compared with a case where the IFA phase difference signal PD2 having a large amplitude is inputted as it is to the FVO 32. In addition, the second control loop section 31 includes an ADPLL, which makes it possible to eliminate need for an A/D converter and achieve reduction in a circuit layout area and power consumption, and the like. Furthermore, it is not necessary to perform control by an AGC function to have a small amplitude, which makes it possible to avoid deterioration in reception performance due to noise.

In addition, the wireless receiver 1 according to the first embodiment further sets the resolution of the low-resolution A/D converter 14 to a resolution that allows for generation of the first control signal VC1 having an amplitude that falls within a linear region of frequency characteristics in input amplitude-frequency characteristics (see FIG. 12) of the variable capacitance diode included in the first input section of the FVO 32.

This configuration makes it possible to convert a signal having a large amplitude, such as an amplitude falling within a nonlinear region of the input amplitude-frequency characteristics of the variable capacitance diode, into a signal having a small amplitude falling within the linear region and then input the signal having a small amplitude to the FVO 32. This makes it possible to more reliably operate the FVO 32 within the linear region, and makes it possible to more reliably avoid deterioration in reception performance due to distortion of the oscillation signal VO caused by nonlinearity of the varactor capacitance. [Modification Example 1 of First Embodiment]

In the first embodiment described above, description has been given of a configuration in which a digital signal outputted from the ADPLL 31 is inputted as the second control signal VC2 to the FVO 32, and the digital demodulation signal DO2 is generated on the basis of a signal obtained by subtracting the coarse D phase difference signal PD3 from the second control signal VC2. A modification example 1 of the first embodiment differs from the first embodiment described above in that a signal obtained by adding the coarse D phase difference signal PD3 to an output signal of the ADPLL 31 is inputted as the second control signal VC2 to the FVO 32, and that the output signal of the ADPLL 31 is regarded as the digital signal DO1 and the demodulation section 34 generates the digital demodulation signal DO2 on the basis of the output signal.

[Configuration of Wireless Receiver 1A According to Modification Example 1 of First Embodiment]

Here, FIG. 8 is a diagram illustrating a configuration example of a wireless receiver according to the modification example 1 of the first embodiment. A wireless receiver 1A according to the present modification example 1 has a configuration including a demodulator 3A in place of the demodulator 3 in the wireless receiver 1 according to the first embodiment described above, as illustrated in FIG. 8.

The demodulator 3A has a configuration including a digital adder 35, which is inserted in a coupling line between the ADPLL 31 and the FVO 32, in place of the digital subtracter 33 in the demodulator 3 according to the first embodiment described above.

In addition, the coarse D phase difference signal PD3 that is an output signal of the CADC 14 is inputted to the digital adder 35, and the digital adder 35 is configured to generate the second control signal VC2 by adding the digital signal DO1, which is a digital signal having a phase opposite to the phase of the IFA phase difference signal PD2 that is the output signal of the ADPLL 31, and the coarse D phase difference signal PD3. Here, the second control loop section (ADPLL) 31 and the digital adder 35 correspond to a second control signal generator described in the scope of claims. In addition, the digital signal DO1 corresponds to a fourth phase difference signal described in the scope of claims.

Furthermore, the digital signal DO1 that is the output signal of the ADPLL 31 is inputted to the demodulation section 34, and the demodulation section 34 is configured to generate the digital demodulation signal DO2 on the basis of the inputted digital signal DO1.

[Operation of Wireless Receiver 1A]

Next, description is given of a specific operation of the wireless receiver 1A according to the modification example 1 of the first embodiment with reference to FIG. 9. Here, FIG. 9 is a waveform diagram of signals passing through wiring lines at positions indicated by (1) to (5) of FIG. 8. Regarding signal waveforms in (1) and (3) of FIG. 9, a vertical axis indicates an analog voltage value, and a horizontal axis indicates time. In addition, regarding signal waveforms in (2), (4), and (5) of FIG. 9, a vertical axis indicates a digital code value, and a horizontal axis indicates time.

It is to be noted that an operation from generating various types of phase difference signals from the reception signal to generating the first control signal VC1 in the first control loop section 30 is substantially similar to that in the first embodiment described above. Specifically, the operation differs in that the CADC 14 outputs the coarse D phase difference signal PD3 to the digital adder 35 in place of the digital subtracter 33. Therefore, an operation after generating the first control signal VC1 is described.

The ADPLL 31 generates, for example, the digital signal DO1 as illustrated in (5) of FIG. 9, which is a digital signal and has a phase opposite to the phase of the IFA phase difference signal PD2 illustrated in (1) of the same diagram, on the basis of the inputted reference signal RCK and the inputted oscillation signal VO. Then, the generated digital signal DO1 is outputted to each of the demodulation section 34 and the digital adder 35.

The digital adder 35 adds the inputted coarse D phase difference signal PD3 and the inputted digital signal DO1 to generate, for example, the second control signal VC2 as illustrated in (4) of FIG. 9, which is digital and has a phase opposite to the phase of the first control signal VC1 illustrated in (3) of the same diagram. Then, the generated second control signal VC2 is outputted to the FVO 32.

The FVO 32 generates the oscillation signal VO on the basis of the inputted first control signal VC1, which is analog, and the second control signal VC2, which is digital. Then, the generated oscillation signal VO is outputted to each of the mixer 12 and the ADPLL 31.

The demodulation section 34 performs publicly known demodulation processing on the inputted digital signal DO1 to generate the digital demodulation signal DO2 obtained by digitally demodulating the received FSK signal. Then, the generated digital demodulation signal DO2 is outputted to the reception data processor 5. The reception data processor 5 performs predetermined processing, corresponding to a system to which the wireless receiver 1 is applied, on the inputted digital demodulation signal DO2. [Workings and Effects of Modification Example 1 of First Embodiment]

In the wireless receiver 1A according to the present modification example 1, the mixer 12 and the LPF 13 generate the IFA phase difference signal PD2 that represents a phase difference between the FSK signal or the PSK signal received through the antenna 2 and the oscillation signal VO. The low-resolution A/D converter 14 performs analog-digital conversion of the IFA phase difference signal PD2 with a resolution (n bits) lower than at least the resolution (N bits) of the digital demodulation signal DO2 that is a final output to generate the coarse D phase difference signal PD3, which is digital. The low-resolution D/A converter 15 performs digital-analog conversion of the coarse D phase difference signal PD3 to generate the coarse A phase difference signal PD4, which is analog. The analog subtracter 16 subtracts the coarse A phase difference signal PD4 from the IFA phase difference signal PD2 to generate the first control signal VC1. The second control loop section (ADPLL) 31 generates the digital signal DO1 having a phase opposite to the phase of the IFA phase difference signal PD2 on the basis of the reference signal RCK and the oscillation signal VO. The digital adder 35 adds the coarse D phase difference signal PD3 and the digital signal DO1 to generate the second control signal VC2 having a phase opposite to the phase of the first control signal VC1. The FVO 32 generates the oscillation signal VO on the basis of the first control signal VC1 and the second control signal VC2. The demodulation section 34 generates the digital demodulation signal DO2 on the basis of the digital signal DO1. This configuration achieves workings and effects similar to those in the first embodiment described above.

In addition, the wireless receiver 1A according to the modification example 1 of the first embodiment further sets the resolution of the low-resolution A/D converter 14 to a resolution that causes the amplitude of the first control signal VC1 to be an amplitude falling within the linear region of the frequency characteristics in the amplitude-frequency characteristics of the variable capacitance diode included in the first input section of the FVO 32. This configuration achieves workings and effects similar to those in the first embodiment described above. [Modification Example 2 of First Embodiment]

In the first embodiment and the modification example 1 thereof described above, description has been given of an example in which the second control loop section 31 includes an ADPLL circuit. A modification example 2 of the first embodiment differs from the first embodiment and the modification example 1 thereof described above in that the second control loop section 31 includes an analog PLL circuit.

[Configuration of Wireless Receiver 1B According to Modification Example 2 of First Embodiment]

Here, FIG. 10 is a diagram illustrating a configuration example of a wireless receiver according to the modification example 2 of the first embodiment.

A wireless receiver 1B according to the modification example 2 has a configuration including a demodulator 3B in place of the demodulator 3 in the wireless receiver 1 according to the first embodiment described above, as illustrated in FIG. 10.

The demodulator 3B has a configuration including a third control loop section 36 and an FVO 32A in place of the second control loop section 31 and the FVO 32 in the demodulator 3 according to the first embodiment described above and further adding an A/D converter 37 (hereinafter referred to as "ADC 37"). Hereinafter, the third control loop section 36 is also referred to as "APLL 36"). Here, the third control loop section (APLL) 36 corresponds to a second control signal generator described in the scope of claims.

In addition, the APLL 36 according to the present modification example 2 includes a publicly known analog PLL circuit, and generates a third control signal AVC3, which is analog and has a phase opposite to the phase of the first control signal VC1, on the basis of the reference signal RCK and the oscillation signal VO, and outputs the generated third control signal AVC3 to each of the FVO 32A and the ADC 37.

The FVO 32A according to the present modification example 2 has a configuration including a third input section (not illustrated) in place of the second input section in the FVO 32 according to the first embodiment described above. The third input section is an input section for the third control signal AVC3, which is analog, and includes a variable capacitive element (e.g., a variable capacitance diode). Here, the third input section corresponds to a second input section described in the scope of claims.

That is, the FVO 32A has a configuration including two signal input sections of a voltage control oscillator (VCO). For example, as illustrated in FIG. 11, the first input section has the variable capacitance C1 that changes in accordance with the first control signal VC1, and the third input section is equivalent to having a variable capacitance C3 that changes in accordance with a third control signal AVC3.

The third control signal AVC3 is a signal having a phase opposite to the phase of the first control signal VC1; therefore, the variable capacitance C1 and the variable capacitance C3 cancel out each other. That is, regarding fluctuation of the frequency of the first control signal VC1 (the reception signal), the third control signal AVC3 acts to prevent the fluctuation.

The ADC 37 according to the present modification example 2 performs A/D conversion of the inputted third control signal AVC3, which is analog, to generate the third control signal DVC3, which is digital, and outputs the generated third control signal DVC3, which is digital, to the digital subtracter 33. Here, the third control signal DVC3 in the modification example 2 corresponds to the second control signal VC2 in the first embodiment.

As with the first embodiment described above, the digital subtracter 33 subtracts the coarse D phase difference signal PD3 from the inputted third control signal DVC3, which is digital, to generate the digital signal DO1, and outputs the generated digital signal DO1 to the demodulation section 34. Here, the ADC 37, the digital subtracter 33, and the demodulation section 34 correspond to a digital demodulation signal generator described in the scope of claims.

That is, the wireless receiver 1B according to the modification example 2 differs in that the second control signal VC2 that is digital and is generated in the ADPLL 31 in the wireless receiver 1 according to the first embodiment described above is generated by performing, by the ADC 37, A/D conversion of the third control signal AVC3 that is analog and is generated in the APLL circuit 36. In addition, the wireless receiver 1B differs in that in the FVO 32, fluctuation of the frequency of the first control signal VC1 is offset by the third control signal AVC3, which is analog. The operation other than those is similar to that of the wireless receiver 1 according to the first embodiment described above. [Workings and Effects of Modification Example 2 of First Embodiment]

In the wireless receiver 1B according to the present modification example 2, the mixer 12 and the LPF 13 generate the IFA phase difference signal PD2 that represents a phase difference between the FSK signal or the PSK signal received through the antenna 2 and the oscillation signal VO. The low-resolution A/D converter 14 performs analog-digital conversion of the IFA phase difference signal PD2 with a resolution (n bits) lower than at least the resolution (N bits) of the digital demodulation signal DO2 that is a final output to generate the coarse D phase difference signal PD3, which is digital. The low-resolution D/A converter 15 performs digital-analog conversion of the coarse D phase difference signal PD3 to generate the coarse A phase difference signal PD4, which is analog. The analog subtracter 16 subtracts the coarse A phase difference signal PD4 from the IFA phase difference signal PD2 to generate the first control signal VC1. The third control loop section (APLL) 36 generates the third control signal AVC3, which is analog, on the basis of the reference signal RCK and the oscillation signal VO. The FVO 32A generates the oscillation signal VO on the basis of the first control signal VC1, which is analog, and the third control signal AVC3, which is analog.

Specifically, the FVO 32 includes the first input section and the third input section. The first input section is an input section for the first control signal VC1, which is analog, and includes a variable capacitive element, and the third input section is an input section for the third control signal AVC3, which is analog, and includes a variable capacitive element. Here, the first input section and the third input section are coupled in parallel to each other. That is, the FVO 32A according to the modification example 2 of the first embodiment is configured to generate the oscillation signal VO on the basis of the first control signal VC1, which is analog and is inputted to the first input section, and the third control signal AVC3, which is analog and is inputted to the third input section.

Further, in the wireless receiver 1B, the ADC 37 performs A/D conversion of the third control signal AVC3, which is analog, to generate the third control signal DVC3, which is digital. The digital subtracter 33 subtracts the coarse D phase difference signal PD3, which is digital, from the third control signal DVC3, which is digital, to generate the digital signal DO1. The demodulation section 34 generates the digital demodulation signal DO2 on the basis of the digital signal DO1.

This configuration achieves workings and effects similar to those in the first embodiment described above. In addition, it is possible to control the FVO 32A by the third control signal AVC3 that is analog and has a phase opposite to the phase of the first control signal VC1, which makes it possible to offset fluctuation of the phase of the oscillation signal VO without an influence of quantization noise.

[Modification Example 3 of First Embodiment]

In the modification example 2 of the first embodiment described above, description has been given of a configuration in which A/D conversion of the third control signal AVC3 that is analog and is generated in the third control loop section (APLL) 36 is performed to generate the third control signal DVC3, which is digital, and the digital signal DO1 is generated by subtracting the coarse D phase difference signal PD3 from the third control signal DVC3, which is digital. In a modification example 3 of the first embodiment, an analog difference signal obtained by subtracting the coarse A phase difference signal PD4 from the third control signal AVC3, which is analog, without directly performing A/D conversion of the third control signal AVC3, which is analog. Then, the modification example 3 differs from the modification example 2 of the first embodiment described above in that the digital signal DO1 is generated by performing A/D conversion of the difference signal.

[Configuration of Wireless Receiver 1C According to Modification Example 3 of First Embodiment]

Here, FIG. 12 is a diagram illustrating a configuration example of a wireless receiver according to a modification example 3 of the first embodiment. A wireless receiver 1C according to the present modification example 3 has a configuration including a demodulator 3C in place of the demodulator 3B in the wireless receiver 1B according to the modification example 2 described above, as illustrated in FIG. 12.

The demodulator 3C has a configuration including an analog subtractor 38 in place of the digital subtractor 33 in the demodulator 3B of the modification example 2 described above and further adding a gain control amplifier 39 (hereinafter referred to as "GCA 39") between the APLL 36 and the analog subtracter 38. In addition, the demodulator 3C has a configuration in which the third control signal AVC3 that is analog and is generated in the APLL 36 is inputted to the GCA 39, and an output signal of the GCA 39 and the coarse A phase difference signal PD4 are inputted to the analog subtracter 38.

Here, while the coarse A phase difference signal PD4 obtained by conversion into an analog signal through the CDAC 15 is the same gain-system standard as the IFA phase difference signal PD2, the third control signal AVC3 that is analog and is demodulated by a gain of the APLL 36 is a standard having the gain of the APLL 36. It is therefore expected not to return to an accurate analog signal by simple subtraction by the analog subtracter 38. Accordingly, in the present modification example 3, the gain of the third control signal AVC3 is adjusted through the GCA 39 having a gain adjustment function.

That is, the AGCA 39 according to the present modification example 3 has a function of adjusting and controlling the gain of the third control signal AVC3 to a signal having the same gain as an output system of the mixer 12. It is to be noted that in a case where it is possible to accurately and correctly control a loop gain of the APLL 36 to a gain that is the same as the gain of the output system of the mixer 12, without being limited to this configuration, a configuration may be adopted in which the analog subtractor 38 directly subtracts the coarse A phase difference signal PD4 from the third control signal AVC3 without passing through the GCA 39.

The analog subtracter 38 according to the present modification example 3 subtracts the inputted coarse A phase difference signal PD4, which is analog, from the inputted third control signal AVC3 that is analog and has been subjected to gain adjustment, and a difference signal ADS that is analog and is a result of such subtraction is outputted to the ADC 37.

The ADC 37 of the present modification example 3 performs A/D conversion of the inputted difference signal ADS, which is analog, to generate the digital signal DO1, and outputs the generated digital signal DO1 to the demodulation section 34. Here, the analog subtracter 38, the ADC 37, and the demodulation section 34 correspond to a digital demodulation signal generator described in the scope of claims.

That is, the wireless receiver 1C according to the present modification example 3 differs in the following point from the wireless receiver 1B according to the modification example 2 described above. That is, the GCA 39 performs gain adjustment on the third control signal AVC3 that is analog and is generated in the APLL circuit 36, and the analog subtracter 38 subtracts the coarse A phase difference signal PD4 from a signal obtained after the gain adjustment. Then, the ADC 37 performs A/D conversion of the difference signal ADS that is a result of such subtraction to generate the digital signal DO1. The operation other than this is similar to that of the wireless receiver 1B according to the modification example 2 described above.

[Workings and Effects of Modification Example 3 of First Embodiment]

In the wireless receiver 1C according to the present modification example 3, the mixer 12 and the LPF 13 generate the IFA phase difference signal PD2 that represents a phase difference between the FSK signal or the PSK signal received through the antenna 2 and the oscillation signal VO. The low-resolution A/D converter 14 performs analog-digital conversion of the IFA phase difference signal PD2 with a resolution (n bits) lower than at least the resolution (N bits) of the digital demodulation signal DO2 that is a final output to generate the coarse D phase difference signal PD3, which is digital. The low-resolution D/A converter 15 performs digital-analog conversion of the coarse D phase difference signal PD3 to generate the coarse A phase difference signal PD4, which is analog. The analog subtracter 16 subtracts the coarse A phase difference signal PD4 from the IFA phase difference signal PD2 to generate the first control signal VC1 for controlling the FVO 32A. The third control loop section (APLL) 36 generates the third control signal AVC3, which is analog, on the basis of the reference signal RCK and the oscillation signal VO. The FVO 32A outputs the oscillation signal VO on the basis of the first control signal VC1, which is analog, and the third control signal AVC3, which is analog. The GCA 39 adjusts the gain of the third control signal AVC3, which is analog, to a gain that is the same as the gain of the output system of the mixer 12. The analog subtracter 38 subtracts the coarse A phase difference signal PD4, which is analog, from the third control signal AVC3, which is analog and has been subjected to gain adjustment, to generate the difference signal ADS, which is analog. The ADC 37 performs A/D conversion of the difference signal ADS, which is analog, to generate the digital signal DO1. The demodulation section 34 generates the digital demodulation signal DO2 on the basis of the digital signal DO1.

This configuration achieves workings and effects similar to those in the modification example 2 described above.

Other Embodiments

As described above, the present disclosure has been described with the embodiments and the modification examples. However, it should not be understood that the descriptions and the drawings constituting a part of this disclosure limit the present disclosure. From this disclosure, various alternative embodiments, examples, and operational techniques will be apparent to those skilled in the art.

For example, in the embodiment described above, a determination section that determines a signal level of the IFA phase difference signal PD2 that is an output signal of the LPF 13 is provided in a stage following the LPF 13 to determine whether or not the IFA phase difference signal PD2 has a signal level equal to or higher than a level that causes distortion resulting from the varactor capacitance. Then, a configuration may be adopted in which the CDAC 14 and the CDAC 15 are used to perform processing of generating the coarse A phase difference signal PD4 only on a signal that is determined as the signal having a signal level equal to or higher than the level that causes distortion. In this case, in a case where it is determined that the signal level of the IFA phase difference signal PD2 is not the level that causes distortion, the IFA phase difference signal PD2 at this time is inputted as it is as the first control signal VC1 to the VCO.

Thus, it must be understood that the present disclosure includes various embodiments and the like that are not described herein. At least one of various kinds of omission, replacement, and modification can be made for the components in the scope without departing from the gist of the embodiments and the modification examples described above. In addition, the effects described herein are merely illustrative and non-limiting, and other effects may be provided. The technical scope of the present disclosure is appointed only by the invention specific matter related appropriate scope of claims from the above description.

It is to be noted that the present disclosure may have the following configurations.

(1)

A demodulator including:

a phase difference signal generator that generates a first phase difference signal representing a phase difference between a digitally modulated digital modulation signal and an oscillation signal;

a low-resolution A/D converter that performs analog-digital conversion of the first phase difference signal with a resolution lower than at least a resolution of a digital demodulation signal, which is a final output, to generate a second phase difference signal that is digital;

a D/A converter that performs digital-analog conversion of the second phase difference signal to generate a third phase difference signal that is analog;

a first control signal generator that subtracts the third phase difference signal from the first phase difference signal to generate a first control signal that is analog;

a second control signal generator that generates, on the basis of a reference signal and the oscillation signal, a second control signal that is analog or digital and has a phase opposite to a phase of the first control signal;

a frequency variable oscillator that generates the oscillation signal on the basis of the first control signal and the second control signal; and a digital demodulation signal generator that demodulates the digital modulation signal on the basis of the second control signal.

(2)

The demodulator according to (1), in which the frequency variable oscillator includes a first input section and a second input section, the first input section being an input section for the first control signal that includes a variable capacitive element, and the second input section being an input section for the second control signal that includes a capacitive element and is coupled in parallel to the first input section, and a resolution of the low-resolution A/D converter is set to a resolution that allows for generation of the first control signal having an amplitude falling within a linear region of input amplitude-frequency characteristics of the variable capacitive element.

(3)

The demodulator according to (2), in which the second control signal generator includes an ADPLL (ALL-Digital Phase Locked Loop) circuit, and is configured to generate a digital signal as the second control signal, the second input section has a configuration in which a least a same number of signal input sections as a bit number of the second control signal are coupled in parallel to each other, the signal input sections each including a capacitive element having a fixed capacitance, the frequency variable oscillator is configured to generate the oscillation signal on the basis of the first control signal that is analog and is inputted to the first input section, and the second control signal that is digital and is inputted to the second input section, and the digital demodulation signal generator is configured to demodulate the digital modulation signal on the basis of a signal obtained by subtracting the second phase difference signal from the second control signal that is digital.

(4)

The demodulator according to (2), in which the second control signal generator includes an analog PLL (Phase Locked Loop) circuit, and is configured to generate an analog signal as the second control signal, the frequency variable oscillator has a configuration in which the second input section includes a variable capacitive element as the capacitive element, and is configured to generate the oscillation signal on the basis of the first control signal that is analog and is inputted to the first input section, and the second control signal that is analog and is inputted to the second input section, and the digital demodulation signal generator is configured to perform A/D conversion of the second control signal that is analog to generate a second control signal that is digital, and demodulate the digital modulation signal on the basis of a signal obtained by subtracting the second phase difference signal from the generated second control signal that is digital.

(5)

The demodulator according to (2), in which the second control signal generator includes an analog PLL (Phase Locked Loop) circuit, and is configured to generate an analog signal as the second control signal, the frequency variable oscillator has a configuration in which the second input section includes a variable capacitive element as the capacitive element, and is configured to generate the oscillation signal on the basis of the first control signal that is analog and is inputted to the first input section, and the second control signal that is analog and is inputted to the second input section, and the digital demodulation signal generator is configured to generate a difference signal by subtracting the third phase difference signal from the second control signal that is analog, and demodulate the digital modulation signal on the basis of a signal obtained by performing A/D conversion of the generated difference signal.

(6)

The demodulator according to any one of (1) to (5), in which the modulation signal includes at least one of an FSK (Frequency Shift Keying) signal or a PSK (Phase-Shift Keying) signal.

(7)

A demodulator including:

a phase difference signal generator that generates a first phase difference signal representing a phase difference between a digitally modulated digital modulation signal and an oscillation signal;

a low-resolution A/D converter that performs analog-digital conversion of the first phase difference signal with a resolution lower than at least a resolution of a digital demodulation signal, which is a final output, to generate a second phase difference signal that is digital;

a D/A converter that performs digital-analog conversion of the second phase difference signal to generate a third phase difference signal that is analog;

a first control signal generator that subtracts the third phase difference signal from the first phase difference signal to generate a first control signal that is analog;

a second control signal generator that generates, on the basis of a reference signal and the oscillation signal, a fourth phase difference signal that is digital and has a phase opposite to a phase of the first phase difference signal, and adds the second phase difference signal to the fourth phase difference signal to generate a second control signal that is digital and has a phase opposite to a phase of the first control signal;

a frequency variable oscillator that generates the oscillation signal on the basis of the first control signal and the second control signal; and a digital demodulation signal generator that demodulates the digital modulation signal on the basis of the fourth phase difference signal.

(8)

The demodulator according to (7), in which the frequency variable oscillator includes a first input section and a second input section, the first input section being an input section for the first control signal that includes a variable capacitive element, and the second input section being an input section for the second control signal that is coupled in parallel to the first input section, the second input section has a configuration in which at least a same number of signal input sections as a bit number of the second control signal are coupled in parallel to each other, the signal input sections each including a capacitive element having a fixed capacitance, a resolution of the low-resolution A/D converter is set to a resolution that allows for generation of the first control signal having an amplitude falling within a linear region of input amplitude-frequency characteristics of the variable capacitive element.

(9)

The demodulator according to (7) or (8), in which the second control signal generator includes an ADPLL (ALL-Digital Phase Locked Loop) circuit that generates the fourth phase difference signal on the basis of the reference signal and the oscillation signal, and a digital adder that adds the second phase difference signal to the fourth phase difference signal to generate the second control signal.

(10)

The demodulator according to any one of (7) to (9), in which the modulation signal includes at least one of an FSK (Frequency Shift Keying) signal or a PSK (Phase-Shift Keying) signal.

(11)

A wireless receiver provided with a demodulator, the demodulator including:

a phase difference signal generator that generates a first phase difference signal representing a phase difference between a digitally modulated digital modulation signal and an oscillation signal;

a low-resolution A/D converter that performs analog-digital conversion of the first phase difference signal with a resolution lower than at least a resolution of a digital demodulation signal, which is a final output, to generate a second phase difference signal that is digital;

a D/A converter that performs digital-analog conversion of the second phase difference signal to generate a third phase difference signal that is analog;

a first control signal generator that subtracts the third phase difference signal from the first phase difference signal to generate a first control signal that is analog;

a second control signal generator that generates, on the basis of a reference signal and the oscillation signal, a second control signal that is analog or digital and has a phase opposite to a phase of the first control signal;

a frequency variable oscillator that generates the oscillation signal on the basis of the first control signal and the second control signal; and a digital demodulation signal generator that demodulates the digital modulation signal on the basis of the second control signal.

(12)

A wireless receiver provided with a demodulator, the demodulator including:

a phase difference signal generator that generates a first phase difference signal representing a phase difference between a digitally modulated digital modulation signal and an oscillation signal;

a low-resolution A/D converter that performs analog-digital conversion of the first phase difference signal with a resolution lower than at least a resolution of a digital demodulation signal, which is a final output, to generate a second phase difference signal that is digital;

a D/A converter that performs digital-analog conversion of the second phase difference signal to generate a third phase difference signal that is analog;

a first control signal generator that subtracts the third phase difference signal from the first phase difference signal to generate a first control signal that is analog;

a second control signal generator that generates, on the basis of a reference signal and the oscillation signal, a fourth phase difference signal that is digital and has a phase opposite to a phase of the first phase difference signal, and adds the second phase difference signal to the fourth phase difference signal to generate a second control signal that is digital and has a phase opposite to a phase of the first control signal;

a frequency variable oscillator that generates the oscillation signal on the basis of the first control signal and the second control signal; and a digital demodulation signal generator that demodulates the digital modulation signal on the basis of the fourth phase difference signal.

REFERENCE SIGNS LIST 1, 1A, 1B, 1C: wireless receiver
2: antenna
3, 3A, 3B, 3C: demodulator
4: crystal oscillator
5: reception data processor
11: low-noise amplifier
12: mixer
13: low-pass filter
14: low-resolution A/D converter (CADC)
15: low-resolution D/A converter (CDAC)
16, 38: analog subtracter
30: first control loop section
31: second control loop section (ADPLL)
32, 32A: frequency variable oscillator (FVO)
33: digital subtracter
34: demodulation section
35: digital adder
36: third control loop section (APLL)
37: A/D converter (ADC)
100: flash type A/D converter
200: pipeline type A/D converter
300: resistance ladder type D/A converter
400: capacitive D/A converter
C1, C2: varactor capacitance
DO2: digital demodulation signal
PD1: phase difference signal
PD2: IFA phase difference signal
PD3: coarse D phase difference signal
PD4: coarse A phase difference signal
VC1: first control signal
VC2: second control signal
VC3: third control signal

The invention claimed is:

1. A demodulator, comprising:
a phase difference signal generator that generates a first phase difference signal representing a phase difference between a digitally modulated digital modulation signal and an oscillation signal;
a low-resolution A/D converter that performs analog-digital conversion of the first phase difference signal with a resolution lower than at least a resolution of a digital demodulation signal, which is a final output, to generate a second phase difference signal that is digital;
a D/A converter that performs digital-analog conversion of the second phase difference signal to generate a third phase difference signal that is analog;
a first control signal generator that subtracts the third phase difference signal from the first phase difference signal to generate a first control signal that is analog;
a second control signal generator that generates, on a basis of a reference signal and the oscillation signal, a second control signal that is analog or digital and has a phase opposite to a phase of the first control signal;
a frequency variable oscillator that generates the oscillation signal on a basis of the first control signal and the second control signal; and
a digital demodulation signal generator that demodulates the digital modulation signal on a basis of the second control signal.

2. The demodulator according to claim 1, wherein
the frequency variable oscillator includes a first input section and a second input section, the first input section being an input section for the first control signal that includes a variable capacitive element, and the second input section being an input section for the second control signal that includes a capacitive element and is coupled in parallel to the first input section, and
a resolution of the low-resolution A/D converter is set to a resolution that allows for generation of the first control signal having an amplitude falling within a linear region of input amplitude-frequency characteristics of the variable capacitive element.

3. The demodulator according to claim 2, wherein
the second control signal generator includes an ADPLL (ALL-Digital Phase Locked Loop) circuit, and is configured to generate a digital signal as the second control signal,
the second input section has a configuration in which a least a same number of signal input sections as a bit number of the second control signal are coupled in parallel to each other, the signal input sections each including a capacitive element having a fixed capacitance, the frequency variable oscillator is configured to generate the oscillation signal on a basis of the first control signal that is analog and is inputted to the first input section, and the second control signal that is digital and is inputted to the second input section, and the digital demodulation signal generator is configured to demodulate the digital modulation signal on a basis of a signal obtained by subtracting the second phase difference signal from the second control signal that is digital.

4. The demodulator according to claim 2, wherein the second control signal generator includes an analog PLL (Phase Locked Loop) circuit, and is configured to generate an analog signal as the second control signal, the frequency variable oscillator has a configuration in which the second input section includes a variable capacitive element as the capacitive element, and is configured to generate the oscillation signal on a basis of the first control signal that is analog and is inputted to the first input section, and the second control signal that is analog and is inputted to the second input section, and the digital demodulation signal generator is configured to perform A/D conversion of the second control signal that is analog to generate a second control signal that is digital, and demodulate the digital modulation signal on a basis of a signal obtained by subtracting the second phase difference signal from the generated second control signal that is digital.

5. The demodulator according to claim 2, wherein the second control signal generator includes an analog PLL (Phase Locked Loop) circuit, and is configured to generate an analog signal as the second control signal, the frequency variable oscillator has a configuration in which the second input section includes a variable capacitive element as the capacitive element, and is configured to generate the oscillation signal on a basis of the first control signal that is analog and is inputted to the first input section, and the second control signal that is analog and is inputted to the second input section, and the digital demodulation signal generator is configured to generate a difference signal by subtracting the third phase difference signal from the second control signal that is analog, and demodulate the digital modulation signal on a basis of a signal obtained by performing A/D conversion of the generated difference signal.

6. The demodulator according to claim 1, wherein the digital modulation signal comprises at least one of an FSK (Frequency Shift Keying) signal or a PSK (Phase-Shift Keying) signal.

7. A demodulator, comprising:

a phase difference signal generator that generates a first phase difference signal representing a phase difference between a digitally modulated digital modulation signal and an oscillation signal;

a low-resolution A/D converter that performs analog-digital conversion of the first phase difference signal with a resolution lower than at least a resolution of a digital demodulation signal, which is a final output, to generate a second phase difference signal that is digital;

a D/A converter that performs digital-analog conversion of the second phase difference signal to generate a third phase difference signal that is analog;

a first control signal generator that subtracts the third phase difference signal from the first phase difference signal to generate a first control signal that is analog;

a second control signal generator that generates, on a basis of a reference signal and the oscillation signal, a fourth phase difference signal that is digital and has a phase opposite to a phase of the first phase difference signal, and adds the second phase difference signal to the fourth phase difference signal to generate a second control signal that is digital and has a phase opposite to a phase of the first control signal;

a frequency variable oscillator that generates the oscillation signal on a basis of the first control signal and the second control signal; and a digital demodulation signal generator that demodulates the digital modulation signal on a basis of the fourth phase difference signal.

8. The demodulator according to claim 7, wherein the frequency variable oscillator includes a first input section and a second input section, the first input section being an input section for the first control signal that includes a variable capacitive element, and the second input section being an input section for the second control signal that is coupled in parallel to the first input section, the second input section has a configuration in which at least a same number of signal input sections as a bit number of the second control signal are coupled in parallel to each other, the signal input sections each including a capacitive element having a fixed capacitance, and a resolution of the low-resolution A/D converter is set to a resolution that allows for generation of the first control signal having an amplitude falling within a linear region of input amplitude-frequency characteristics of the variable capacitive element.

9. The demodulator according to claim 7, wherein the second control signal generator includes an ADPLL (ALL-Digital Phase Locked Loop) circuit that generates the fourth phase difference signal on a basis of the reference signal and the oscillation signal, and a digital adder that adds the second phase difference signal to the fourth phase difference signal to generate the second control signal.

10. The demodulator according to claim 7, wherein the digital modulation signal comprises at least one of an FSK (Frequency Shift Keying) signal or a PSK (Phase-Shift Keying) signal.

11. A wireless receiver provided with a demodulator, the demodulator comprising:

a phase difference signal generator that generates a first phase difference signal representing a phase difference between a digitally modulated digital modulation signal and an oscillation signal;

a low-resolution A/D converter that performs analog-digital conversion of the first phase difference signal with a resolution lower than at least a resolution of a digital demodulation signal, which is a final output, to generate a second phase difference signal that is digital;

a D/A converter that performs digital-analog conversion of the second phase difference signal to generate a third phase difference signal that is analog;

a first control signal generator that subtracts the third phase difference signal from the first phase difference signal to generate a first control signal that is analog;

a second control signal generator that generates, on a basis of a reference signal and the oscillation signal, a second control signal that is analog or digital and has a phase opposite to a phase of the first control signal;

a frequency variable oscillator that generates the oscillation signal on a basis of the first control signal and the second control signal; and a digital demodulation signal generator that demodulates the digital modulation signal on a basis of the second control signal.

12. A wireless receiver provided with a demodulator, the demodulator comprising:

a phase difference signal generator that generates a first phase difference signal representing a phase difference between a digitally modulated digital modulation signal and an oscillation signal;

a low-resolution A/D converter that performs analog-digital conversion of the first phase difference signal with a resolution lower than at least a resolution of a digital demodulation signal, which is a final output, to generate a second phase difference signal that is digital;

a D/A converter that performs digital-analog conversion of the second phase difference signal to generate a third phase difference signal that is analog;

a first control signal generator that subtracts the third phase difference signal from the first phase difference signal to generate a first control signal that is analog;

a second control signal generator that generates, on a basis of a reference signal and the oscillation signal, a fourth phase difference signal that is digital and has a phase opposite to a phase of the first phase difference signal, and adds the second phase difference signal to the fourth phase difference signal to generate a second control signal that is digital and has a phase opposite to a phase of the first control signal;

a frequency variable oscillator that generates the oscillation signal on a basis of the first control signal and the second control signal; and a digital demodulation signal generator that demodulates the digital modulation signal on a basis of the fourth phase difference signal.

* * * * *